* (12) United States Patent O'Niell et al.

(10) Patent No.: US 7,756,695 B2
(45) Date of Patent: Jul. 13, 2010

(54) ACCELERATED SIMULATION AND VERIFICATION OF A SYSTEM UNDER TEST (SUT) USING CACHE AND REPLACEMENT MANAGEMENT TABLES

(75) Inventors: Clark M. O'Niell, White Plains, NY (US); Joseph A. Perrie, III, Austin, TX (US); Steven L. Roberts, Cedar Park, TX (US); Christopher J. Spandikow, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 995 days.

(21) Appl. No.: 11/464,122

(22) Filed: Aug. 11, 2006

(65) Prior Publication Data

US 2008/0126068 A1    May 29, 2008

(51) Int. Cl.
*G06F 17/50* (2006.01)
*G06F 9/455* (2006.01)
(52) U.S. Cl. .......................................... 703/14; 703/23
(58) Field of Classification Search ............. 703/13–15, 703/23; 717/128
See application file for complete search history.

(56) References Cited

U.S. PATENT DOCUMENTS

| 5,946,472 | A * | 8/1999 | Graves et al. .................. 703/6 |
| 2006/0129999 | A1* | 6/2006 | Hiraoka et al. .............. 717/128 |
| 2007/0074000 | A1* | 3/2007 | Colwill et al. ................. 712/11 |

\* cited by examiner

*Primary Examiner*—Paul L Rodriguez
*Assistant Examiner*—Luke Osborne
(74) *Attorney, Agent, or Firm*—Dillon & Yudell LLP (57) ABSTRACT

A cache replacement system for extending the debugging capabilities of accelerated simulation by enabling enhanced cache data and state checking is provided. The system includes a Cell Broadband Engine Architecture (CBEA) compliant system implementing Replacement Management Tables in an accelerated simulation environment. The RMTs control cache replacement and allow the software to direct entries with specific address ranges at a particular subset of the cache. The RMTs further allow for locking data in the cache and are utilized to prevent overwriting data in the cache by directing data that is known to be used only once at a particular set. Using the locking mechanism in an accelerated simulation environment, a user is able to run code sets, which, when the microprocessor system being tested is correctly designed, generates identical and verifiable data and cache states in each of the different sets of the cache.

16 Claims, 4 Drawing Sheets

FIGURE 6 ved simulation techniques, the present invention provides an improved verification methodology to extend the debugging capabilities of accelerated simulation.

ACCELERATED SIMULATION AND VERIFICATION OF A SYSTEM UNDER TEST (SUT) USING CACHE AND REPLACEMENT MANAGEMENT TABLES

BACKGROUND OF THE INVENTION

1. Technical Field

The present invention relates generally to microprocessor systems and in particular to the testing of microprocessor systems. Still more particularly, the present invention relates to the testing of microprocessor systems in an accelerated simulation environment using cache and replacement management tables.

2. Description of the Related Art

With the increasing complexity of microprocessor designs, a parallel increase in the resources devoted to verifying a design's correctness has also been made. The number of potential logic combinations on a microprocessor has far exceeded the number of atoms in the universe, and thus, ensuring the validity of a microprocessor's design is truly a Herculean task. Numerous methodologies are employed to tackle this seemingly insurmountable problem. One of the primary methods is cycle simulation. Cycle simulation uses a software model of a hardware design to simulate the cycle by cycle state transitions of a synchronous design. The current state of the art cycle simulators are able to simulate tens or possibly hundreds of cycles per second, which corresponds to several minutes of microprocessor operations. Thus, even using contemporary cycle simulators, the number of cycles that one can hope to simulate before fabrication only corresponds to a minimal period (i.e., the several minutes) of actual microprocessor operation. Because of finite resources, the state space one is able to cover with cycle simulation is limited.

To improve the coverage provided by cycle simulation, formal verification is also frequently employed. Formal verification proves mathematically that the hardware design is functioning as intended. While formal verification is extremely effective, this method requires significant resources to support, and not all parts of a design are practical to verify using this methodology. Typically, only small parts of a design can be verified formally because designs are often too big or too complex to fully employ formal verification.

Accelerated simulation is yet another methodology with its own pros and cons used to verify a microprocessor's validity. Accelerated simulation refers to the process of mapping the synthesizable portion of the design into a hardware platform to increase performance by evaluating the high definition language (HDL) constructs in parallel. The method does not map the remaining portions of the simulation into hardware but runs them in a software simulator. The software simulator works with the hardware platform to exchange simulation data. Removing most of the simulation events from the software simulator and evaluating them in parallel improve performance. Accelerated simulation makes use of an FPGA or other hardware to drastically increase the speed of simulation. Accelerated simulation is orders of magnitude faster than cycle simulation, achieving simulation speeds of thousands or tens of thousands of cycles per second. To achieve these drastic increases in performance, accelerated simulation foregoes much of the checking used in either formal verification or cycle simulation. As a result, the checking is less thorough and failures are much harder to debug. Because of this lack of checking, additional algorithms and methods that enable a subsequent "self check" are frequently required to be executed following the accelerated simulation.

In the light of the above limitations with conventional accelerated simulation techniques, the present invention provides an improved verification methodology to extend the debugging capabilities of accelerated simulation.

SUMMARY OF THE INVENTION

In accordance with the present invention, a cache replacement system for extending the debugging capabilities of accelerated simulation by enabling enhanced cache data and state checking is provided. The system includes an emulator/accelerator, a workstation, a model of the microprocessor system being tested and a CBEA (Cell Broadband Engine Architecture) compliant system implementing Replacement Management Tables (RMTs). Further, the system includes direct high-speed/high-bandwidth connections between the emulator/accelerator system, the host workstation and the CBEA-compliant (RMT-implementing) system.

Cache Replacement in a CBEA-compliant system is managed by RMTs. RMTs allow the software to direct entries with specific address ranges at a particular subset of the cache. This mechanism allows for locking data in the cache and may also be used to prevent overwriting data in the cache by directing data that is known to be used only once at a particular set. In an accelerated simulation environment, implementation of this locking mechanism results in the user's ability to lock different portions of the cache and isolate data in order to check cache data and states. Using the locking mechanism in an accelerated simulation environment, a user is able to run code sets, which, when the microprocessor system being tested is correctly designed, will generate identical (and verifiable) data and cache states in each of the different sets of the cache. Thus, Replacement Management Tables improve the debugging capabilities of accelerated simulation.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method and system for extending the debugging capabilities of accelerated simulation by enabling enhanced cache data and state checking using a Cell Broadband Engine Architecture (CBEA) based cache replacement management system. It should be noted that the terms "accelerated simulation" or "emulator" as used within the description of the invention may refer to: (a) a hardware emulator; (b) a simulation accelerator; (c) an emulator used as a simulation accelerator; or (d) a simulation accelerator used as an emulator.

In the CBEA-compliant system as utilized within the invention, cache management is controlled by Replacement Management Tables (RMTs). RMTs allow the software to direct entries with specific address ranges at a particular subset of the cache. This mechanism allows for locking data in the cache and is also used to prevent overwriting data in the cache by directing data that is known to be used only once at a particular set. Providing these functions enables increased efficiency and increased real-time control of the processor.

In an accelerated simulation environment, implementation of this locking mechanism results in the user's ability to lock different portions of the cache and isolate data in order to check cache data and states. Using the locking mechanism in an accelerated simulation environment, a user is able to run code sets, which, when the microprocessor system being tested is correctly designed, will generate identical (and verifiable) data and cache states in each of the different sets of the cache.

In the following detailed description of exemplary embodiments, specific exemplary embodiments by which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and equivalents thereof.

It is also understood that the use of specific parameter names are for example only and not meant to imply any limitations on the invention. The invention may thus be implemented with different nomenclature/terminology utilized to describe the above parameters, without limitation.

Additionally, within the descriptions of the various figures, similar elements are provided similar names and reference numerals as those of the previous figure(s). Where a later figure utilizes the element in a different context or with different functionality, the element is provided a different leading numeral representative of the figure number (e.g., 2xx for FIG. 2 and 3xx for FIG. 3). The specific numerals assigned to the elements are provided solely to aid in the description and not meant to imply any limitations (structural or functional) on the invention.

Figure 1:
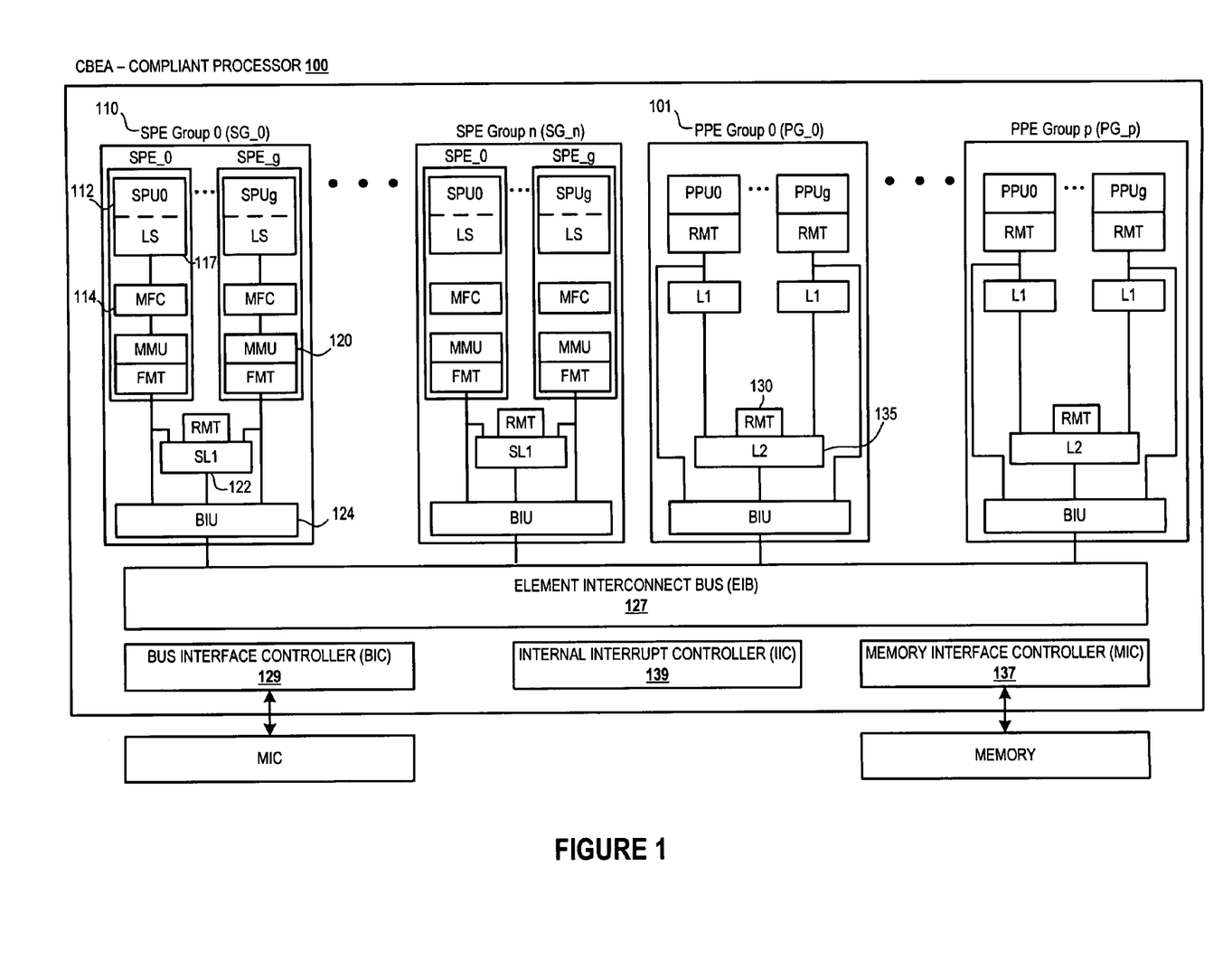
FIG. 1 is a block diagram of a Cell Broadband Engine Architecture (CBEA) system, within which features of the invention may be implemented.

With reference now to the figures, FIG. 1 depicts a Cell Broadband Engine Architecture (CBEA). FIG. 1 illustrates a CBEA-compliant processor 100 in which a group of Synergistic Processor Elements (SPEs) 110 share single SL1 cache 122 (SL1 cache 122 is a first-level cache for DMA transfers between local storage 117 and main storage) and a group of PowerPC Processor Elements (PPEs) 101 share single second-level (L2) cache 135. Also included in the illustration are two controllers typically found in a processor: Memory Interface Controller (MIC) 137 and Bus Interface Controller (BIC) 129. Connecting the various units within processor 100 is an Element Interconnect Bus (EIB) 127.

Physically, CBEA-compliant processor 100 may consist of a single chip, a multi-chip module (or modules), or multiple single-chip modules on a motherboard or other second-level package, depending on the technology used and the cost/performance characteristics of the intended design point. Logically, the CBEA defines four separate types of functional components: PowerPC Processor Element (PPE) 101, Synergistic Processor Unit (SPU) 112, Memory Flow Controller (MFC) 114 and Internal Interrupt Controller (IIC) 139. The computational units in the CBEA-compliant processor are PPE 101 and SPU 112. Each SPU 112 has dedicated local storage 117, dedicated MFC 114 with its associated Memory Management Unit (MMU) 120 which can hold and process memory-protection and access-permission information, and its Replacement Management Table (RMT). The combination of these components is referred to as a SPU Element, or SPE 110.

A processor may include multiple groups of PPEs (PPE groups) and multiple groups of SPEs (SPE groups). Hardware resources may be shared between units within a group. However, the SPEs 110 and PPEs 101 appear as independent elements to the configuring software.

According to the described embodiment, the CBEA-compliant system comprises the following components:
1. One or more PowerPC Processor Elements (PPEs)
2. One or more Synergistic Processor Elements (SPEs), which are the combination of a Synergistic Processor Units (SPUs), a local storage area, and a Memory Flow Controller (MFC)
3. One Internal Interrupt Controller (IIC) and
4. One Element Interconnect Bus (EIB) for connecting units within the processor.

Figure 2:
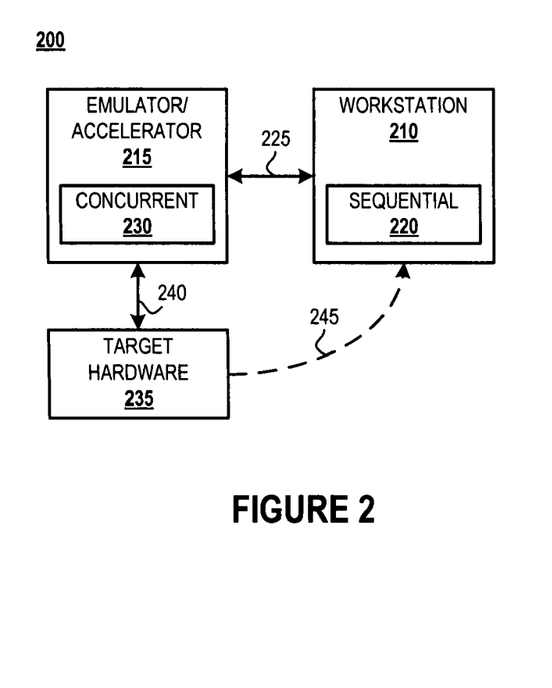
FIG. 2 is a block diagram of an accelerated simulation environment, according to one embodiment of the invention.

Referring now to FIG. 2, there is depicted a block diagram representation of an emulator/accelerator environment 200 which includes workstation 210 executing sequential operations model 220, emulator/accelerator 215 executing concurrent operations model 230, and target hardware 235. Workstation 210 is coupled to emulator/accelerator 215 via communication link 225. In addition, emulator/accelerator environment 200 includes high speed/high bandwidth communication link 240, linking emulator/accelerator 215 with target hardware 235 and optional feed-back link 245, linking target hardware 235 with workstation 210. Emulator/accelerator 215 is a large-scale hardware configuration implemented with Field Programmable Gate Arrays (FPGAs) or some other type of custom hardware. Emulator/accelerator 215 is capable of emulating many different types of computer system hardware components including, for example, memory devices. Emulator/accelerator 215 is capable of modeling concurrent operations such as concurrent operations model 230. Since emulator/accelerator 215 is designed to operate under the control of workstation 210, sequential operations model 220 and concurrent operations model 230 may operate in parallel (at the same time).

Target hardware system 235 includes any hardware that needs to be tested, whether the hardware is a portion of an integrated circuit, an entire integrated circuit, or multiple integrated circuits. Target hardware system 235 may be a part of a system under test and can represent any system or portion of a system that needs to be tested. One example of target hardware system 235 is a personal computer with the microprocessor removed. Also, a prototype microprocessor may be modeled using emulator/accelerator 215 and attached to target hardware system 235 via communication link 240. In this embodiment, communication link 240 consists of several interface cables and adapter pods. Target hardware system 235 is then exercised and tested for compliance with design parameters and specifications.

Workstation 210 may be any type of microprocessor-based computer or computer system known to those skilled in the art. Workstation 210 typically provides test data (such as test vectors) to emulator/accelerator 215 or target hardware system 235, which then performs the desired tests. Results of the test may be returned to workstation 210 via optional feedback link 245 or may be passed via communication link 240 to emulator/accelerator 215 and then to workstation 210 via communication link 225.

Communication link 225 is usually implemented with memory components (not shown) located within workstation 210. Software-based simulation systems typically have the ability to create models that can represent either concurrent or sequential operations. Concurrent modeling refers to a description of operational behavior which is designed to represent actual hardware logic components, where many events occur in parallel or at the same time. Each of these events will typically represent the transfer of information from one internal system register or memory location to another. Sequential modeling, on the other hand, is used to simulate operations or events which happen only one at a time in a serial fashion. With sequential modeling, the flow of events progresses from one to another in a sequence or series of steps.

Figure 5:
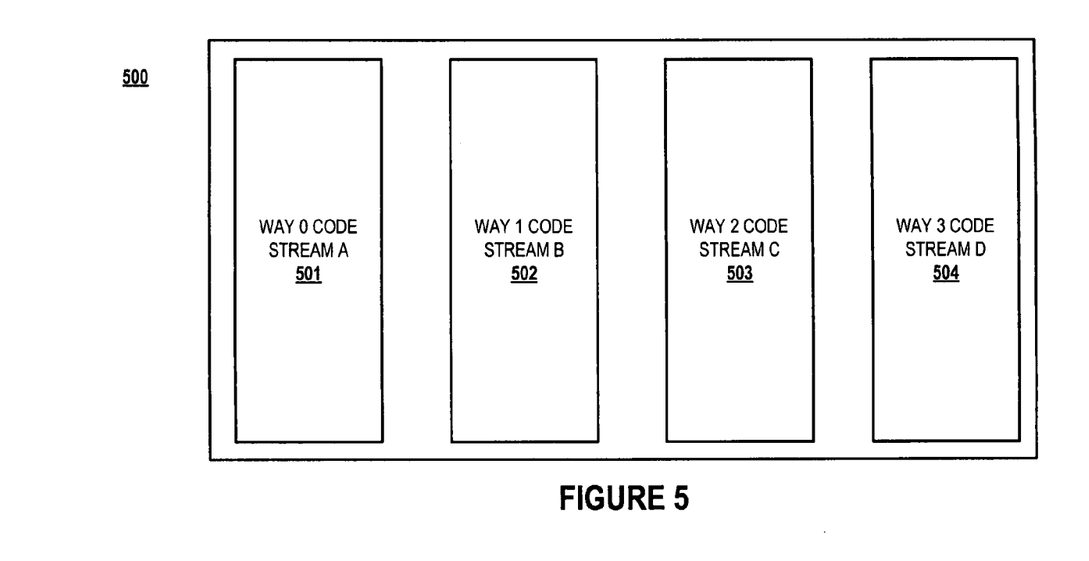
FIG. 5 is a block diagram showing a 4-way set associative cache with RMTs, according to one embodiment of the invention.

In the described embodiment of the present invention, target system 235 is a CBEA-compliant processor system 100 with a 4-way set associative cache memory system employing Remote Management Tables (RMTs) (as illustrated by FIG. 5). In an alternate embodiment of the present invention, a CBEA-compliant processor system with a 4-way set associative cache memory system employing RMTs may have its concurrent operations modeled by emulator/accelerator 215, its sequential operations modeled by the workstation 210 with Target System 235 representing, if any, only some portion of the CBEA-compliant system.

Important considerations for determining cache performance are the organization of the cache and the cache management policies that are employed in the cache. In general, a cache can be organized into either a direct-mapped or set-associative configuration. In a direct-mapped configuration, the physical address space of the computer is conceptually divided into a number of equal pages, with the page size equaling the size of the cache.

A set-associative cache includes a number of banks, or ways, of memory that are each equivalent in size to a conceptual page defined in main memory. Accordingly, a page offset in main memory can be mapped to a number of locations in the cache equal to the number of ways in the cache. For example, in a four-way set-associative cache, a line or page offset from main memory can reside in the equivalent page offset location in any of the four ways of the cache. Additionally, each of the ways in a multiple way cache is partitioned into a number of sets each having a certain number of lines. In addition, a set-associative cache usually includes a cache replacement algorithm such as a Least Recently Used (LRU) algorithm, which determines which bank or way with which to fill data when a read miss occurs. "Cache replacement" as referred to herein relates to a process of replacement of data stored in a cache memory array with other data.

Figure 3:
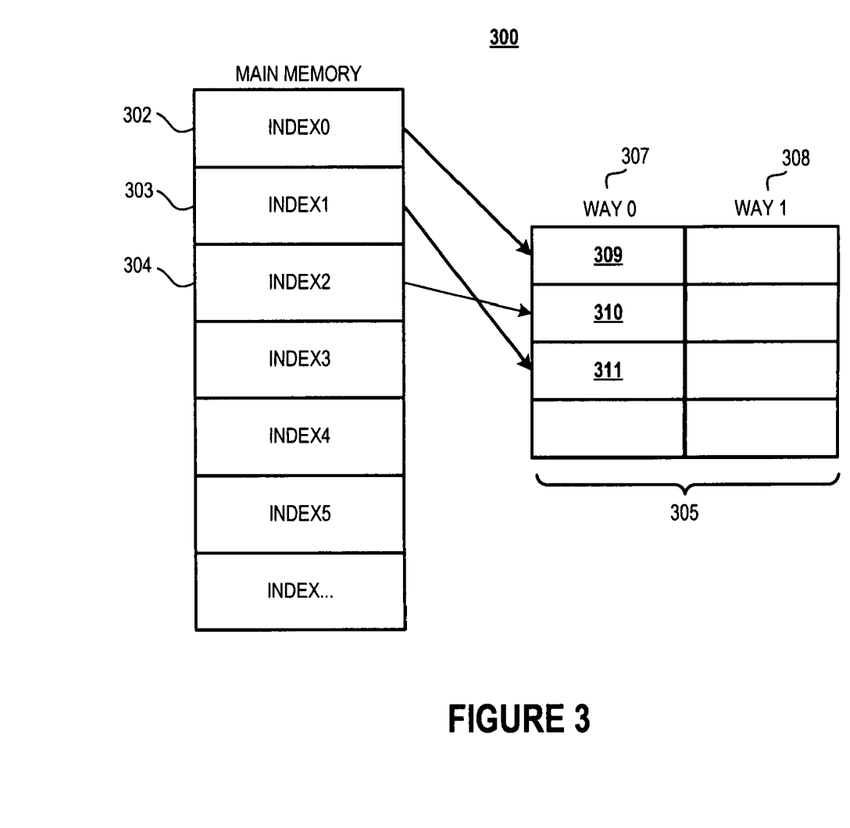
FIG. 3 is a diagram showing 2-way set associative cache mapping using RMTs, according to one embodiment of the invention.

In the Cell Broadband Engine Architecture (CBEA), the management of cache replacement is controlled by Replacement Management Tables (RMTs) which allow software to direct entries with specific address ranges at a particular subset of the cache. As an example, a 2-way set associative cache mapping methodology is illustrated in FIG. 3. In FIG. 3, an example of the described embodiment, cache mapping structure 300, which is a 2-way set associative cache mapping methodology using RMTs, is illustrated. In cache mapping structure 300, address entries 302-304, which reside in main memory 301, are mapped using RMTs to cache locations 309-311 in 2-way set associative cache 305 comprising Way 0 307 and Way 1 308.

CBEA-based RMTs also allow for locking data in the cache and may also be used to prevent overwriting data in the cache by directing data that is known to be used only once at a particular set. Using the locking mechanism in an accelerated simulation environment, a user is able to run code sets that, when the microprocessor system being tested is correctly designed, will generate identical (and verifiable) data and cache states in each of the different sets of the cache. Specifically, a user is able to modify the address range of the load and store operations in the code sequence so that they fall into different partitions in the cache. Providing these functions enables increased efficiency and increased real-time control of the processor.

The Cell Broadband Engine Architecture (CBEA) provides a method of controlling the cache replacement based on a replacement class identifier (RClassID). The class ID is provided as a parameter in the Memory Flow Controller (MFC) instructions and is generated from the load-and-store address for PowerPC Processor Element (PPE) operations. The class ID is used to generate an index to a privileged-software managed table, which is used to control the replacement policy.

Figure 4:
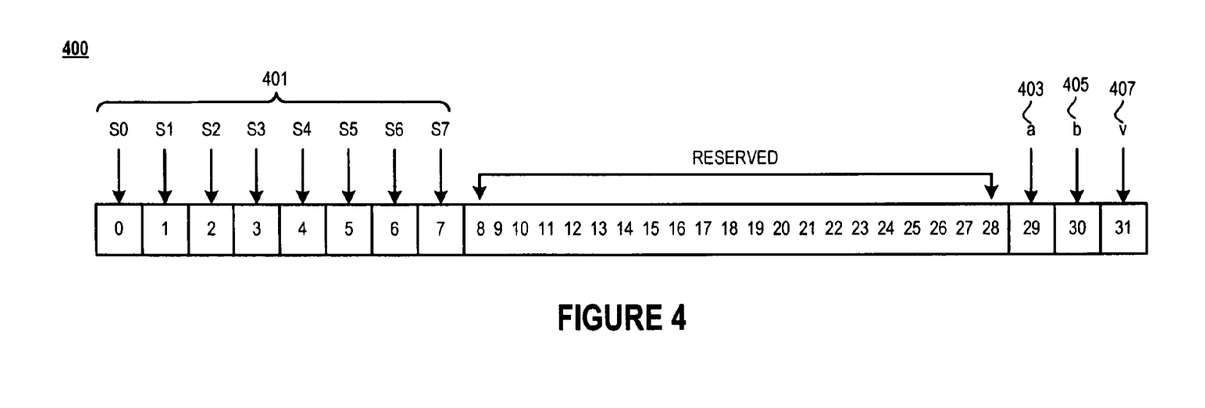
FIG. 4 is a table showing a typical RMT entry for an 8-way set associative cache, according to one embodiment of the invention.

The format of the Replacement Management Table (RMT) is implementation-dependent. Any CBEA-compliant implementation provides an RMT for each major cache structure. FIG. 4 depicts a typical RMT entry for an 8-way, set-associative cache. The cache replacement is controlled by privileged software through a Relay Module (RM). Each level of cache has an independent RMT. The RMT consists of an implementation-dependent number of entries, which contain set-enable bits 401, valid bit 407, and other control information. Optionally, an implementation may also provide cache bypass bit 405 and algorithm bit 403. The number of entries and the size of each entry in the RMT table are implementation-dependent.

The RMT table is located in the real address space of the system memory. The RMT defines which sets in the set-associative cache are to be used for the respective replacement management class. If the value of the set-enable bit for the respective set is '1', that set is used by that replacement class in the RMT entry. If the set-enable bit is not set (i.e., value equal to "0"), the associated set is not used for operations involving the respective replacement management class. One or more sets can be used for more than one replacement management class.

Using the replacement management policies described in the CBEA, code streams may be "locked" into different cache sets. After code streams that are expected to produce identical output to a cache set are executed under separate RMTs in an accelerated simulation, the results are systematically verified by comparing each stream's cache set to a cache set that had been output from a parallel code stream. The test fails if there is any variation in cache data or state. Set associative caches without a locking feature are not able to gain benefit from this accelerated simulation algorithm because the hardware replacement algorithm can not guarantee the code streams will not overwrite each other's cache data and states. A 4-way set associative cache with RMTs is illustrated in FIG. 5.

Figure 6:
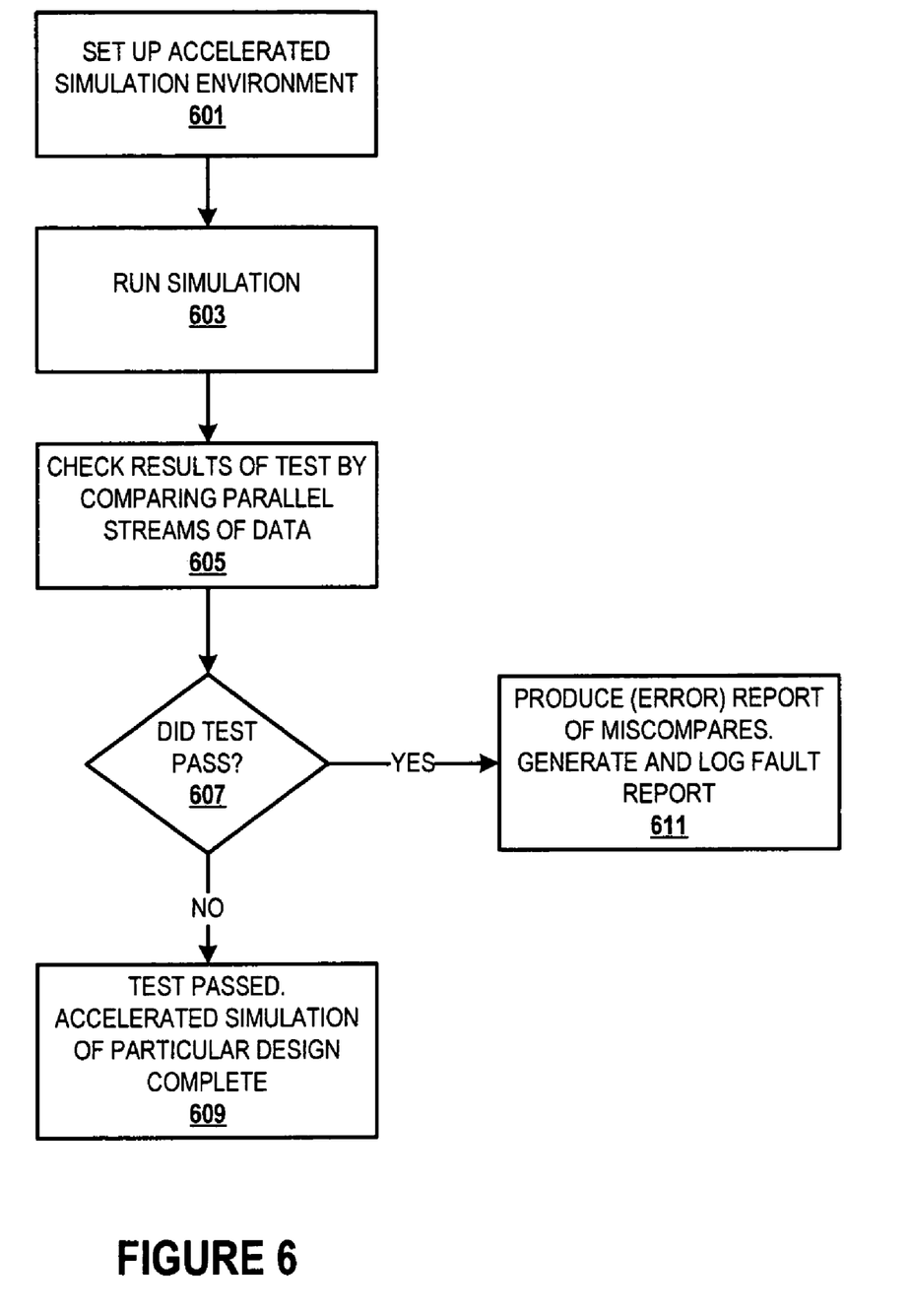
FIG. 6 is a flowchart depicting the steps taken to exploit RMTs' cache locking and data isolation features in an accelerated simulation environment, according to one embodiment of the invention.

In a preferred embodiment of the present invention, design verification for which the cache locking and data isolation features of RMTs are exploited, is accomplished by following the steps as outlined in FIG. 6 which illustrates the Process for Accelerated Simulation and Improved Verification 600. Initially, the Accelerated Simulation environment is set up, as shown in block 601. Then at block 603, a simulation run takes place under the control of workstation 210. Following, as indicated at block 605, a results check is carried out. The results check is completed by comparing parallel streams of data in pre-determined cache locations, as the user searches for any variation. In the embodiment which utilizes a four-way set associative cache with RMTs, each of the different Ways 501-504 of the cache contains a separate code stream (A, B, C, and D, respectively) output region. According to this 4-way set associative cache embodiment, when a four-way system is used to generate four output regions, the correctness of these regions will be checked in the following way. First check Way 0 501 with Ways 1, 2, 3 502-504, and if they all match, then the test has passed.

Returning to the process, a determination of whether the results check passes is made at block 607. If the test passed, each of these regions would contain identical results after the code stream execution is complete. The identical results indicate that the system under test is functioning properly and/or meets the design requirements, and the accelerated simulation of the particular design is complete, as depicted at block 609. However, if the test fails, the simulation produces an error report of the miscompares and generates a log fault report, as shown at block 611.

When the test fails, one or more of the Ways of the cache will be different to the other regions. If any of the Ways miscompare, then a detailed report of the miscompares is produced, in one embodiment, by examining all of the Ways with all of the other Ways to produce a precise signature of the miscompare. Results are fed back to the host system or workstation 210, which flags the error, and a failure report is generated and logged.

As FIGS. 1-6 illustrate, with the corresponding descriptions above, Replacement Management Tables provide a very flexible and powerful tool that extends the capabilities of accelerated simulation. Accelerated simulation is generally known for its drastic performance increase over other simulation methods. However, performance is increased at the expense of less checking and great difficulty in debugging failures. Fortunately, Replacement Management Tables provide a mechanism for locking data in the cache and a way to prevent overwriting data in the cache. In an accelerated simulation environment, implementation of this mechanism results in the user's ability to lock different portions of the cache and isolate data in order to check cache data and states. The above described embodiments of the invention allows accelerated simulation to improve its debugging capabilities and achieve more complete verification by way of more thorough data checking.

Those of ordinary skill in the art will appreciate that the emulator/accelerator environment 200 may vary. For example, the operational and control functions normally under the direction of workstation 210 may be programmed into a behavior card. Thus the behavior card becomes one embodiment of a sequential control system in accordance with the present invention. In such embodiment, Workstation 210 transfers the instructions necessary to run the desired simulation into the behavior card. It should be noted that other types of program sources are contemplated and are within the scope of the present invention. For example, an Erasable Programmable Read Only Memory (EPROM) might be used to provide the instructions for the behavior card. Alternatively, a Direct Access Storage Device (DASD) may be used as a program source. Basically, any type of connection or system, internal or external to the behavior card that may be used to provide the necessary data or instructions may be considered a program source. Thus, the depicted example is not meant to imply architectural limitations with respect to the present invention.

While the invention has been particularly shown and described with reference to a preferred embodiment, it will be understood by those skilled in the art that various changes in form and detail may be made therein without departing from the spirit and scope of the invention.

What is claimed is:

1. A system that enables enhanced accelerator/emulator simulation and testing of a device under test (DUT), said system comprising:

a workstation executing a first code of sequential operations;

an emulator/accelerator concurrently executing a similar code of sequential operations and coupled to said workstation via a first communication link, wherein the first code and similar code of sequential operations are executed in parallel;

a target hardware coupled to the emulator/accelerator via a second communication link, said target hardware being the DUT and configured as a CBEA (Cell Broadband Engine Architecture)-compliant system designed with Replacement Management Tables (RMTs), said CBEA-compliant system having an N-way set-associative cache, wherein said cache includes a cache replacement algorithm that is controlled by said RMTs, which RMTs enable software to direct entries with specific address ranges at a particular subset of the cache, and enables a user to prevent overwriting data in the cache by directing data that is used only once at a particular set among the N ways and by locking data in the cache, wherein said RMTs enables code streams to be "locked" into different ways within the N-way set associative cache; and logic within the emulator/accelerator for exercising and testing said target hardware for compliance with design parameters and specifications, said logic comprising logic for:

enabling a user to modify the address range of load and store operations in the similar code so that the operations each modify different partitions in the cache of the CBEA-complaint system, whereby the user is able to run code sets that generate data and cache states in each of the different sets of the N sets within the cache; and deterministically locking, via the RMTs, specific cache locations identified by user input and executing code following an RMT-directed modification of said specific cache locations by said load and store operations;

wherein said workstation further comprises:

logic for executing code streams in parallel that are expected to produce identical results to a cache set under separate RMTs in an accelerated simulation, logic for verifying the results by comparing each stream's cache set to a cache set outputted from a parallel code stream, wherein said verifying comprises comparing both a cache data and a cache state generated by each of the parallel code streams to determine whether there is a variation in either the cache data or in the cache state; and logic for identifying and outputting the test as a failure when a variation is found during said comparing.

2. The system of claim 1, further comprising:
wherein said workstation provides said similar operations code to said emulator/accelerator and to said target hardware as test data, to enable said emulator/accelerator and said target hardware to both perform a series of processes, which processes result in output data that modifies a cache and associated cache states of the N-way set associative cache controlled via the RMTs.

3. The system of claim 1, wherein:
when said CBEA-compliant system has multiple caches, said target hardware comprises multiple RMTs, one for each of the multiple caches, such that each level of cache has an independent RMT;
said RMT comprises a number of entries, each containing set-enable bits, a valid bit, and other control bits; and
said RMT defines which sets in the N-way set-associative cache are to be used for a corresponding replacement management class, and wherein a first value of the set-enable bits enables a particular way to be utilized by that corresponding replacement class in the RMT entry and a second value prevents use of the particular way for operations involving the corresponding replacement management class.

4. The system of claim 1, further comprising:
means for providing feedback of the results of the testing at the target hardware to said workstation, said means comprising at least one of:
 logic for communicating a result of the test to said workstation via second communication link to said emulator/accelerator and then via first communication link to said workstation; and
 a feed-back communication link connecting said target hardware with said workstation, wherein said feed-back communication link returns results of the test to the workstation via a direct route.

5. The system of claim 1, wherein:
said emulator/accelerator is a large-scale hardware configuration implemented with Field Programmable Gate Arrays (FPGAs) and is capable of emulating different types of computer system hardware components, including memory devices, and is controllable via the workstation;
said emulator/accelerator comprises logic for modeling the executing operations code, such that concurrent operations are modeled by said emulator/accelerator, while sequential operations are modeled by the workstation; and
said system further comprises a microprocessor modeled utilizing the emulator/accelerator and attached to said target hardware via said second communication link, whereby functional operations of said target system is modeled by said emulator/accelerator.

6. The system of claim 5, wherein:
said emulator/accelerator provides models that represent concurrent operations to represent actual hardware logic components, wherein events occur in parallel and each event represents a transfer of information from one internal system register or memory location to another; and
said emulator/accelerator provides sequential modeling to simulate operations and events that occur only one at a time, in a serial fashion.

7. The system of claim 1, said workstation further comprising:
logic for initiating a simulation run of the test hardware;
logic for completing a results check by comparing parallel streams of data in pre-determined cache locations to search for a variation, wherein when the cache is an N-way set associative cache with RMTs, such that each of the different ways of the cache contains a separate code stream output region, said completing a results check comprises checking a first way with each other ways, such that Way 0 is checked against each of Ways 1 to Way(N−1), to determine if the data and cache states within all Ways match;
logic for indicating that the results check passed when all the ways match; and
logic for indicating that the results check failed when at least one way does not match; and
logic for generating an error/fault report of each miscompares among the Ways and logging the error report.

8. The system of claim 1, wherein operational and control functions of the workstation are provided via a programmable behavior card, wherein instruction code necessary to run a desired simulation is programmed on the behavior card.

9. A workstation as described in claim 1, comprising:
a processor;
one or more communication ports for coupling the workstation to external devices, including a device-under test and an emulator/accelerator;
an input device for receiving user input of executable code and modifications to said executing code;
executing logic for enabling RMTs in an accelerated simulation environment, whereby a mechanism for locking data in the cache and preventing overwriting data in the cache is provided, which enables a user to lock different portions of the cache and isolate data in order to later check cache data and cache states; and
executing logic for completing a system verification and debugging via the enhanced accelerated simulation.

10. A method for completing testing and verification of a CBEA-complaint device under test (DUT) with replacement management tables (RMTs), said method comprising:
coupling the DUT to an emulator/accelerator, said emulator/accelerator comprising logic for modeling said DUT and concurrently executing similar code to said DUT;
coupling the emulator/accelerator to a workstation having:
 a processor;
 one or more communication ports for coupling the workstation to external devices, including the device-under test and the emulator/accelerator;
 executing logic for enabling RMTs in an accelerated simulation environment, whereby a mechanism for locking data in the cache and preventing overwriting data in the cache is provided, which enables a user to lock different portions of the cache and isolate data in order to later check cache data and cache states; and
 executing logic for completing a system verification and debugging via the enhanced accelerated simulation;
said workstation further comprises program code for:
 comparing the output data with a predetermined correct output data generated when the system under tests operating according to design parameters; and
 determining if the system under test is operating according to design parameters, wherein when the microprocessor system being tested is correctly designed, said output data is identical to said predetermined correct output data and said cache exhibits correct cache states in each of the different sets of the cache.

11. The method of claim 10, wherein the workstation comprises:
an input device for receiving user input of executable code and modifications to said executing code;
program code for activating the executing logic for completing system verification and debugging; and
program code for modifying the address range of load and store operations in a code sequence so that the operations fall into different partitions in the cache; and
program code for initiating enhanced accelerated simulation via execution on the workstation of a code sequence, which generates an output data that is stored within selected ways of the cache via the RMT.

12. The method of claim 10, wherein:
said RMTs enable executing software to direct entries with specific address ranges at a particular subset of the cache;
said RMTs enable locking data in the cache and preventing overwriting of said data in the cache by directing data that is known to be used only once at a particular set within the cache;
said RMTs enable a user to lock different portions of the cache and isolate data within the accelerated simulation environment, in order to check cache data and states; and
said CBEA-compliant device comprises a set-associative cache having a plurality of ways, wherein each way is individually accessible and comprises one or more sets.

13. The method of claim 10, said workstation further comprising program code for:
initiating a simulation run of the test hardware;
completing a results check by comparing parallel streams of data in pre-determined cache locations to search for a variation, wherein when the cache is an N-way set associative cache with RMTs, such that each of the different ways of the cache contains a separate code stream output region, said completing a results check comprises checking a first way with each other ways, such that Way 0 is checked against each of Ways 1 to Way(N−1), to determine if the data and cache states within all Ways match;
indicating that the results check passed when all the ways match;
indicating that the results check failed when at least one way does not match; and
generating an error/fault report of each miscompares among the Ways and logging the error report.

14. A computer program product comprising:
a computer readable medium; and
program code on said computer readable medium for:
receiving user input of executable code and modifications to said executing code;
activating the executing logic for completing system verification and debugging;
modifying the address range of load and store operations in a code sequence so that the operations fall into different partitions in a cache; and
initiating enhanced accelerated simulation via execution on a workstation of a code sequence, which generates an output data that is stored within selected ways of the cache via the RMT;
wherein said program code is executed on a workstation within a testing environment having:
a workstation executing a first code of sequential operations;
an emulator/accelerator concurrently executing a similar code of sequential operations and coupled to said workstation via a first communication link, wherein the first code and similar code of sequential operations are executed in parallel;
a target hardware coupled to the emulator/accelerator via a second communication link, said target hardware being the DUT and configured as a CBEA (Cell Broadband Engine Architecture)-compliant system designed with Replacement Management Tables (RMTs), said CBEA-compliant system having an N-way set-associative cache, wherein said cache includes a cache replacement algorithm that is controlled by said RMTs, which RMTs enable software to direct entries with specific address ranges at a particular subset of the cache, and enables a user to prevent overwriting data in the cache by directing data that is used only once at a particular set among the N ways and by locking data in the cache, wherein said RMTs enables code streams to be "locked" into different ways within the N-way set associative cache; and
logic within the emulator/accelerator for exercising and testing said target hardware for compliance with design parameters and specifications, said logic comprising logic for:
enabling a user to modify the address range of load and store operations in the similar code so that the operations each modify different partitions in the cache of the CBEA-complaint system, whereby the user is able to run code sets that generate data and cache states in each of the different sets of the N sets within the cache; and
deterministically locking, via the RMTs, specific cache locations identified by user input and executing code following an RMT-directed modification of said specific cache locations by said load and store operations;
wherein the program code further comprises code for:
comparing the output data with a predetermined correct output data generated when the system under tests operating according to design parameters; and
determining if the system under test is operating according to design parameters, wherein when the microprocessor system being tested is correctly designed, said output data is identical to said predetermined correct output data and said cache exhibits correct cache states in each of the different sets of the cache.

15. The computer program product of claim 14, wherein:
said RMTs enable executing software to direct entries with specific address ranges at a particular subset of the cache;
said RMTs enable locking data in the cache and preventing overwriting of said data in the cache by directing data that is known to be used only once at a particular set within the cache;
said RMTs enable a user to lock different portions of the cache and isolate data within the accelerated simulation environment, in order to check cache data and states; and said CBEA-compliant device comprises a set-associative cache having a plurality of ways, wherein each way is individually accessible and comprises one or more sets.

16. The computer program product of claim 15, said workstation further comprising program code for:

initiating a simulation run of the test hardware;

completing a results check by comparing parallel streams of data in pre-determined cache locations to search for a variation, wherein when the cache is an N-way set associative cache with RMTs, such that each of the different ways of the cache contains a separate code stream output region, said completing a results check comprises checking a first way with each other ways, such that Way 0 is checked against each of Ways 1 to Way(N−1), to determine if the data and cache states within all Ways match;

indicating that the results check passed when all the ways match;

indicating that the results check failed when at least one way does not match; and generating an error/fault report of each miscompares among the Ways and logging the error report.

* * * * *